US006606250B1

(12) United States Patent
Shi

(10) Patent No.: US 6,606,250 B1
(45) Date of Patent: Aug. 12, 2003

(54) CIRCUIT BOARD HAVING A STABLE L-SHAPED ANTENNA

(75) Inventor: Eric Shi, Hsin Chuang (TW)

(73) Assignee: Global Sun Technology Inc., Taipei (TW)

(*) Notice: Subject to any disclaimer, the term of this patent is extended or adjusted under 35 U.S.C. 154(b) by 0 days.

(21) Appl. No.: 10/178,830

(22) Filed: Jun. 21, 2002

(51) Int. Cl.[7] .......................... H05K 7/02; H05K 1/00; H01Q 1/12

(52) U.S. Cl. ...................... 361/760; 361/737; 361/736; 361/742; 361/807; 361/748; 343/700 MS; 174/260

(58) Field of Search ............................... 361/736, 737, 361/807, 814, 804, 770, 742, 758, 748, 760; 343/700, 700 MS; 156/293; 174/260

(56) References Cited

U.S. PATENT DOCUMENTS 5,537,123 A * 7/1996 Mandai et al. ....... 343/700 MS
5,969,680 A * 10/1999 Tsuru et al. ......... 343/700 MS
6,034,636 A * 3/2000 Saitoh ........................ 343/700
6,255,994 B1 * 7/2001 Saito .......................... 343/700
6,423,915 B1 * 7/2002 Winter ....................... 200/292
6,509,882 B2 * 1/2003 McKivergan ............... 343/818
6,538,605 B2 * 3/2003 Lebaric et al. ....... 343/700 MS
6,539,207 B1 * 3/2003 del Castillo et al. .......... 455/90
2002/0104615 A1 * 8/2002 Lebaric et al. .............. 156/293

* cited by examiner

*Primary Examiner*—David Martin
*Assistant Examiner*—Dameon E. Levi

(57) ABSTRACT

A circuit board includes an antenna having an extension extended from one end and secured to the circuit board and having a free end. A supporting member may be secured on the circuit board and disposed below the antenna for supporting the free end of the antenna. The extension of the antenna is preferably higher than the supporting member, for supporting the antenna member in an inclined position relative to the circuit board. The antenna preferably includes two or more legs engaged into and secured to the circuit board for solidly securing to the circuit board.

1 Claim, 5 Drawing Sheets

ANTENNA G1241IMU-AI-81

TEST DATE:2002/04/29

TEST FREQUENCY:2442MHz

TEST POLARIZATION:VERTICAL
(H-PLANE)

TEST ANTENNA: HORN ANTENNA

TEST STEP DEGREE: 2 DEGREE

TEST CHAMBER: RF CHAMBER

TEST PERSONNEL:BUNNY

MAX GAIN :2.88dBi
MIN GAIN :-17.62dBi
AVE GAIN :-3.65dBi

ANTENNA G1241MU-AI-8I

TEST DATE:2002/04/29

TEST FREQUENCY:2442MHz

TEST POLARIZATION:HORIZONTAL
(E-PLANE)

TEST ANTENNA: HORN ANTENNA

TEST STEP DEGREE: 2 DEGREE

TEST CHAMBER: RF CHAMBER

TEST PERSONNEL:BUNNY

MAX GAIN :2.23dBi
MIN GAIN :-12.25dBi
AVE GAIN:-2.59dBi

CIRCUIT BOARD HAVING A STABLE L-SHAPED ANTENNA

BACKGROUND OF THE INVENTION

1. Field of the Invention

The present invention relates to a circuit board, and more particularly to a circuit board having a stable supporting structure for stably supporting an antenna.

2. Description of the Prior Art

Typical antennas have been developed to be attached onto the electric circuit boards by welding processes. The typical antennas comprise only a single foot or limb engaged into the electric circuit boards, and then secured to the electric circuit boards with the typical welding processes. However, the single foot or limb of the typical antenna may not be solidly secured to the electric circuit boards and may be easily loosened from the electric circuit boards, particularly when the typical antennas are depressed or forced relative to the electric circuit boards inadvertently by the other objects.

The present invention has arisen to mitigate and/or obviate the afore-described disadvantages of the conventional antennas.

SUMMARY OF THE INVENTION

The primary objective of the present invention is to provide a circuit board including a stable supporting structure for stably supporting the antenna on the electric circuit board.

In accordance with one aspect of the invention, there is provided a circuit board comprising a circuit board body including two or more orifices formed therein, and an antenna including a first end having at least two legs extended therefrom and engaged into the orifices of the circuit board body, for solidly securing the antenna to the circuit board body.

The antenna includes an extension extended from the first end thereof, and perpendicular to the antenna, and having the legs extended from the extension.

The extension includes a bottom end having a limb extended therefrom, and perpendicular to the extension, and having the legs extended from the limb. The limb is preferably parallel to the antenna and parallel to the circuit board body for snugly securing onto the circuit board body.

A supporting member may further be provided and secured on the circuit board body and disposed below the second end of the antenna for supporting the second end of the antenna.

The extension of the antenna preferably includes a height greater than that of the supporting member, for supporting the antenna member in an inclined position relative to the circuit board body.

Further objectives and advantages of the present invention will become apparent from a careful reading of a detailed description provided hereinbelow, with appropriate reference to accompanying drawings.

DETAILED DESCRIPTION OF THE PREFERRED EMBODIMENT

Figure 1:
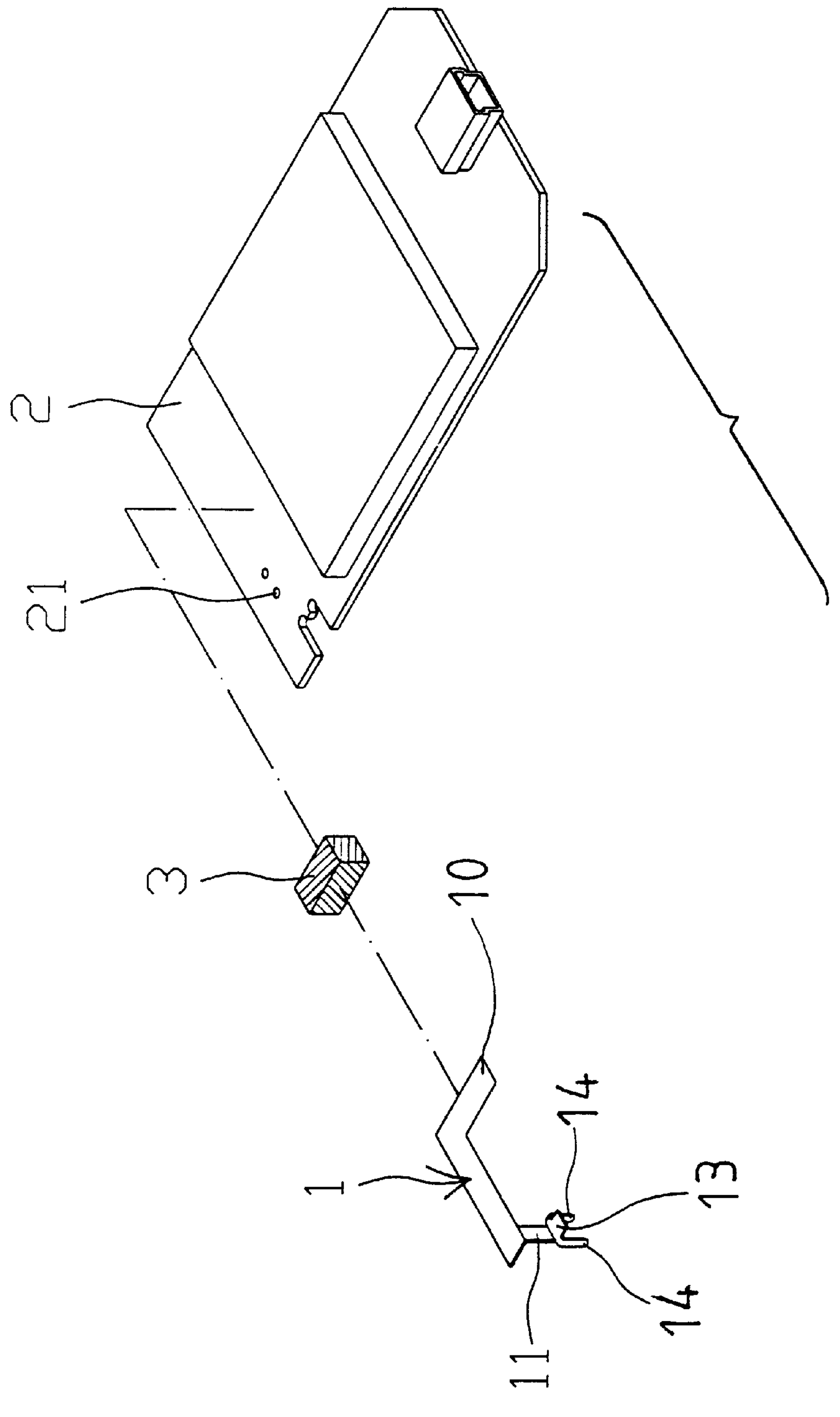
FIG. 1 is an exploded view of a circuit board in accordance with the present invention.

Referring to the drawings, and initially to FIGS. 1–4, a circuit board in accordance with the present invention comprises an antenna 1 to be attached to a circuit board body 2. The circuit board body 2 includes two or more orifices 21 formed therein, and one or more electric parts or elements 22, 23 attached thereto.

The antenna 1 includes an antenna member 10 disposed horizontally and having an extension 11 extended downwardly from one end thereof for engaging onto the circuit board body 2, and a limb 13 laterally extended from or bent from the bottom end of the extension 11, and two or more legs 14 extended downwardly from the limb 13.

It is preferable that the antenna 1 is L-shaped, and is preferably electroplated with a silver outer layer, for preventing the antenna 1 from being rusted, and for maintaining the native characteristics of the antenna member 10.

Figure 4:
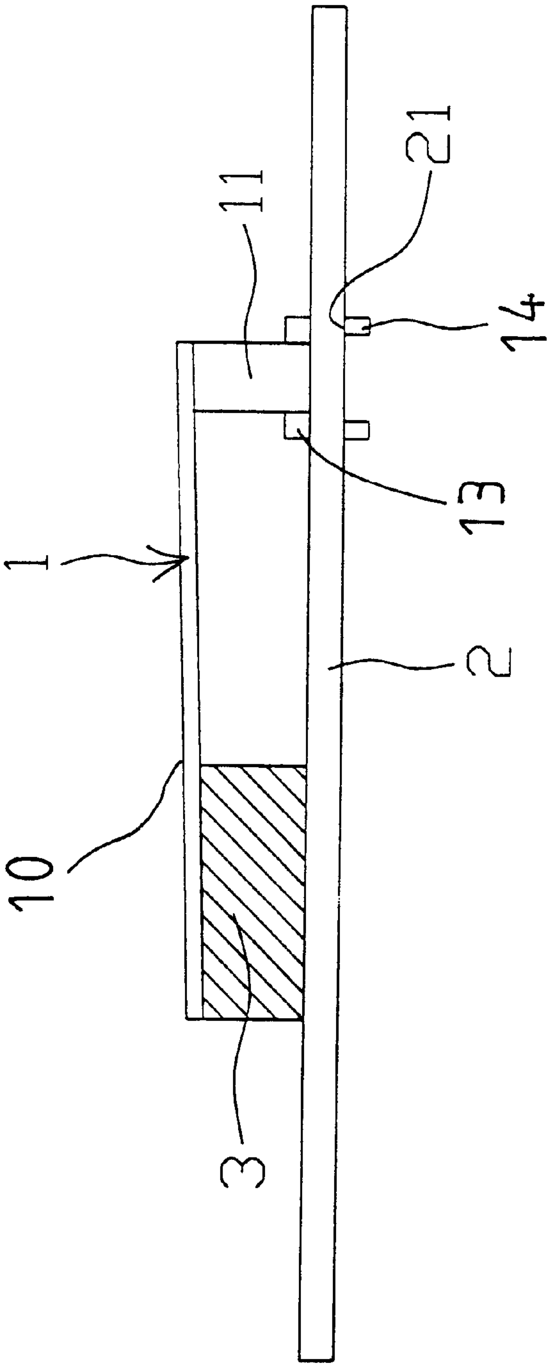
FIG. 4 is a side view of the circuit board.

As best shown in FIG. 4, the L-shaped antenna member 10 is substantially horizontally and parallel to the circuit board body 2. The extension 11 which is extended downwardly from the antenna member 10 is perpendicular to the circuit board body 2.

The limb 13 is preferably perpendicular to the extension 11 and parallel to the circuit board body 2, for snugly engaged onto the circuit board body 2, and may then be solidly secured to the circuit board body 2 by welding processes, with a welding portion 12 or the like.

The legs 14 are extended downwardly from the limb 13, and thus preferably perpendicular to the limb 13 and the circuit board body 2, for engaging into the orifices 21 of the circuit board body 2. The legs 14 may be welded to the circuit board body 2, instead of, or in addition to the welding portion 12.

A supporting member 3 may further be provided and secured on the circuit board body 2 with such as the adhering materials, and disposed below the other end of the antenna member 10, for supporting the other end of the antenna member 10.

The other end of the antenna member 10 is preferably and simply supported by the supporting member 3, and is not necessarily be secured to the supporting member 3, for supporting the antenna member 10 in the substantially horizontal position.

The supporting member 3 may be made of rubber materials, the plastic materials, the spongy materials, the foamable materials, or the other synthetic materials, that are preferably soft or resilient for suitably supporting the other end or the free end of the antenna member 10 in place.

As best shown in FIG. 4, it is preferable that the height of the supporting member 3 is slightly smaller than that of the extension 11 of the antenna member 10, or the extension 11 has a height greater than that of the supporting member 3, for supporting the antenna member 10 in a slightly inclined position relative to the circuit board body 2, for facilitating the outwardly emitting of the signals or energy from the antenna member 10.

Figure 5:
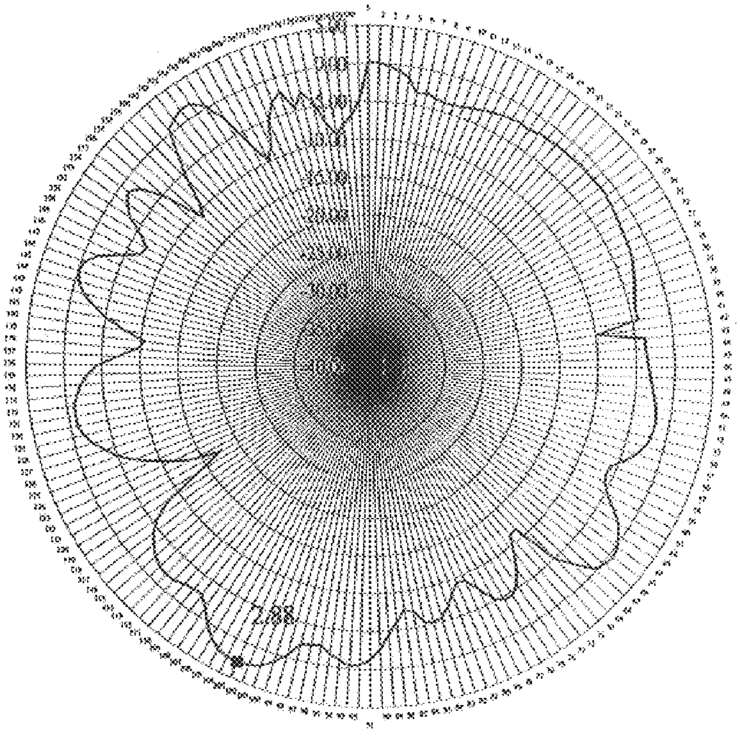
FIG. 5 is a chart illustrating the result of an experiment for the circuit board.

Referring next to FIG. 5, illustrated is a chart showing the result of an experiment or a test, on Apr. 29, 2002, to an antenna which is numbered as G12411MU-AI-81, and which is preferable a horn antenna, and which has a structure as shown in FIGS. 1–4.

The test is tested with a test frequency of 2442 MHz, in an H-plane horizontal test polarization, and in a test step degree of 2 degrees, and in a radio frequency chamber, and is tested by Bunny.

The result of the test shows that the maximum gain is 2.88 dBi, the minimum gain is −17.62 dBi, and the average gain is −3.65 dBi.

Figure 6:
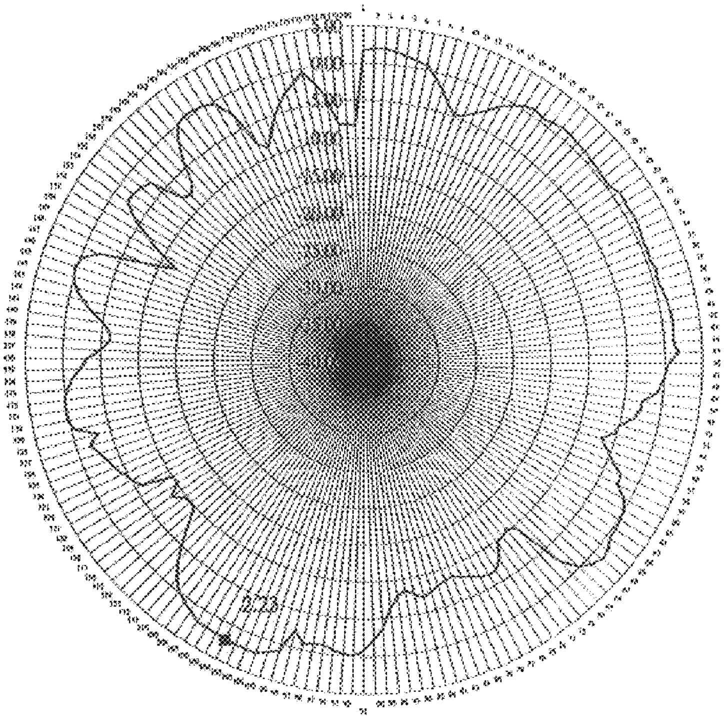
FIG. 6 is a chart similar to FIG. 5, illustrating the result of another experiment for the circuit board in another test polarization.

Referring next to FIG. 6, illustrated is the result of another test, on Apr. 29, 2002, to the same antenna, with the same test frequency and test step degree, and also tested in a radio frequency chamber by Bunny, but in an E-plane horizontal test polarization. The result of the test shows that the maximum gain is 2.23 dBi, the minimum gain is −12.25 dBi, and the average gain is −2.59 dBi.

Figure 3:
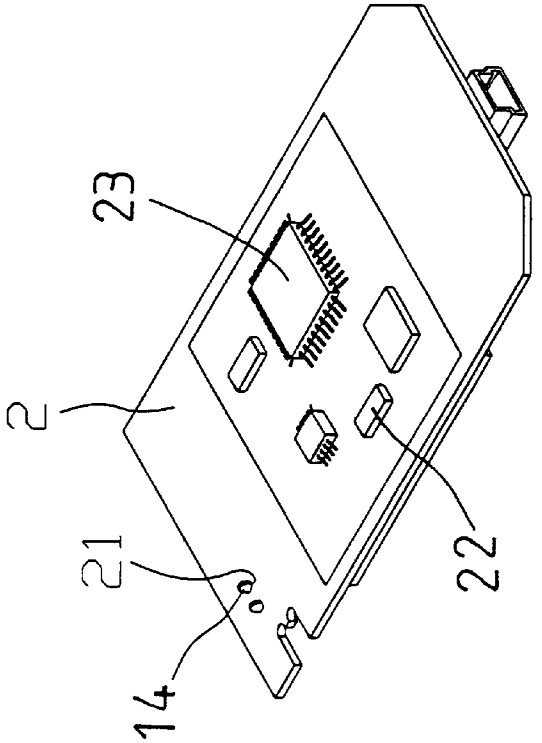
FIG. 3 is a bottom perspective view of the circuit board.
Figure 2:
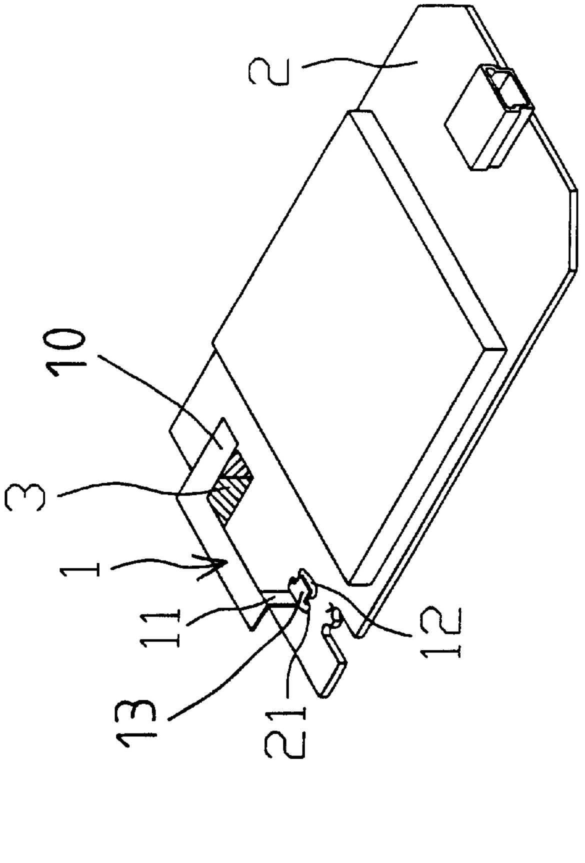
FIG. 2 is an upper perspective view of the circuit board.

In operation, as shown in FIGS. 2–4, the securing or the engagement of the two or more legs 14 of the antenna 1 into the orifices 21 of the circuit board body 2 may solidly secure the antenna 1 to the circuit board body 2, and may prevent the antenna 1 from rotating relative to the circuit board body 2.

Alternatively, when the antenna member 10 has one or more legs 14, the supporting member 3 may be provided for stably supporting the other end or the free end of the antenna member 10, for preventing the antenna member 10 from being bent or distorted inadvertently.

It is to be noted that the legs 14 may be directly extended from the one end of the antenna member 10, or extended from the extension 11, or extended from the limb 13, for solidly engaging into the orifices 21 of the circuit board body 2.

Accordingly, the circuit board in accordance with the present invention includes a stable supporting structure for stably supporting the antenna on the electric circuit board.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A circuit board comprising:

a circuit board body including at least one orifice formed therein, an L-shaped antenna including a first end having an extension extended downwardly therefrom, said extension including a bottom end having a limb extended therefrom, and perpendicular to said extension, and having at least one leg extended from said limb and engaged into said at least one orifice of said circuit board body, to secure said antenna to said circuit board body, said antenna including a second end, and a resilient supporting member disposed on said circuit board body, and disposed below said second end of said antenna for supporting said second end of said antenna, said extension of said antenna including a height greater then that of said resilient supporting member, to resiliently support said antenna in an inclined position relative to said circuit board body.

* * * * *